US012705411B2

(12) United States Patent
Rakheeb et al.

(10) Patent No.: US 12,705,411 B2
(45) Date of Patent: Aug. 11, 2026

(54) METHOD OF OPTIMIZING AREA FOR LOGIC CELLS AND OPTIMIZED LOGIC CELLS

(71) Applicant: SAMSUNG ELECTRONICS CO., LTD., Suwon-si (KR)

(72) Inventors: Abdur Rakheeb, Bengaluru (IN); Sudhakar Gajjavarapu, Bengaluru (IN); Abhishek Ghosh, Bengaluru (IN)

(73) Assignee: Samsung Electronics Co., Ltd., Suwon-Si (KR)

( * ) Notice: Subject to any disclaimer, the term of this patent is extended or adjusted under 35 U.S.C. 154(b) by 699 days.

(21) Appl. No.: 18/112,889

(22) Filed: Feb. 22, 2023

(65) Prior Publication Data

US 2024/0232496 A1 Jul. 11, 2024

(30) Foreign Application Priority Data

Jan. 5, 2023 (IN) ............................ 202341001159

(51) Int. Cl.
*G06F 30/392* (2020.01)
*G06F 30/327* (2020.01)

(52) U.S. Cl.
CPC .......... *G06F 30/392* (2020.01); *G06F 30/327* (2020.01)

(58) Field of Classification Search
CPC ............................ G06F 30/392; G06F 30/327
See application file for complete search history.

(56) References Cited

U.S. PATENT DOCUMENTS 7,800,409 B2 9/2010 Pitts
9,679,895 B2 6/2017 Fachmann et al.
10,192,859 B2 1/2019 Aton et al.
10,396,778 B1 * 8/2019 Narayan ............ H03K 19/0016
10,860,777 B1 * 12/2020 Chuang ................. G06F 30/392
11,062,074 B2 7/2021 Chang et al.
11,443,094 B2 9/2022 Hu et al.
2007/0157145 A1 * 7/2007 Hung ...................... G06F 30/39 716/122
2009/0259981 A1 * 10/2009 Patel ..................... G06F 30/392 716/119
2015/0380483 A1 * 12/2015 Mallikarjunaswamy .................... H10D 30/603 257/494
2019/0211475 A1 * 7/2019 Ito ......................... G06F 30/398
2020/0019666 A1 * 1/2020 Lai ......................... G06F 30/398
2022/0208642 A1 * 6/2022 Okano .................... H01L 24/08
2023/0043245 A1 * 2/2023 Syu ...................... H10D 84/038
2023/0343785 A1 * 10/2023 Wang ....................... H10D 1/66
2023/0352486 A1 * 11/2023 Prasad ................. H10D 84/853
2024/0211674 A1 * 6/2024 Pihl ......................... G06F 30/39

OTHER PUBLICATIONS

Office Action in Indian Appln. No. 202341001159, mailed on Aug. 29, 2025, 5 pages.

* cited by examiner

*Primary Examiner* — Nha T Nguyen
(74) *Attorney, Agent, or Firm* — Fish & Richardson P.C.

(57) ABSTRACT

A method of optimizing area of logic cells includes creating a plurality of terminator cells for the logic cell, wherein the logic cell includes a plurality of cells. The plurality of terminator cells are placed at the boundary or edge of the logic cells.

12 Claims, 14 Drawing Sheets

Vpwell
Source
Gate
Drain
Vdd
110
N+
P+
N+
N+
P+
N+
P+
N-well
P-well
Deep N-well
N-well
P-substrate
$R_{P-sub}$
108
102
104
106

METHOD OF OPTIMIZING AREA FOR LOGIC CELLS AND OPTIMIZED LOGIC CELLS

CROSS-REFERENCE TO RELATED APPLICATIONS

A claim of priority under 35 U.S.C. § 119 is made to Indian Patent Application No. 202341001159, filed Jan. 5, 2023 in the Indian Intellectual Patent Office, the entirety of which is hereby incorporated by reference.

BACKGROUND

The present disclosure generally relates to methods of designing logic cells, and more particular to methods of optimizing area of logic cells.

Application specific integrated circuits (ASICs) may be designed via the implementation of various logic cells. A logic cell may have multi-domain cells and multi-well cells having different voltage domains/wells. Examples of logic cells which have multi-well/multi-domains may include level shifter cells which may have voltage domains VDDI and VDDO, external power cells which may have a voltage domain VDDE, and custom macrocells which may be separated by guard rings and may have voltage domains VDDH and VDDL.

A dual well level shifter structure may for example include a triple well, metal and an n-type well, and may have width of about 2.574 μm and height of about 1.056 μm including an area of about 2.7181 $\mu m^2$ in a 14 nm level shifter cell. The area overhead of such a dual well structure may thus be huge as compared to a deep well structure having multi-domain cells. Other dual well level shifter structures may include a triple well surrounded by a deep well/triple well to effectively isolate the voltage of first and second domains. Such a deep well/triple well level shifter in a 14 nm level shifter cell may have a cell width of about 9.906 μm and cell height of about 8.448 μm including over a very large area of about 83.685 $\mu m^2$.

As a further example, a single cell in a triple well level shifter structure may be isolated by a top deep well covering the structure and a bottom deep well covering the structure. Still further, multiple cells in a triple well level shifter structure may for example include 3 multi-domain cells, and each cell may include a top deep well covering the structure and a bottom deep well covering the structure.

The multi-domain/multi well cells have different voltage domains/wells which need to be isolated. The isolation may be provided by a deep well ring structure or a guard ring structure. However, these ring structures have a large design rule check (DRC) requirement which increases the cell area by a significant amount, thereby increasing the overall area in digital design.

Accordingly, there is a need for a mechanism of optimizing area of a logic cell while providing isolation.

SUMMARY

Embodiments of the inventive concepts provide a method of optimizing area in a logic cell using a design tool, including creating a plurality of terminator cells for the logic cell using the design tool, wherein the logic cell includes a plurality of cells; and placing the plurality of terminator cells at the boundary or edge of the logic cell.

Embodiments of the inventive concepts further provide a logic cell including a plurality of cells; and a plurality of terminator cells at the boundary or edge of the logic cell. Further, the terminator cells may include a plurality of layers of cells where the plurality of layers are made of same cells as the plurality of cells in the logic cell.

BRIEF DESCRIPTION OF THE DRAWINGS

These and other features, aspects, and advantages of the disclosure will become better understood when the following detailed description is read with reference to the accompanying drawings in which like characters represent like parts throughout the drawings, wherein:

FIG. 1 illustrates a sectional view of a deep n-well structure, according to embodiments of the inventive concepts;

FIG. 8 illustrates a diagram of a logic cell having a non-rectangular structure, according to embodiments of the inventive concepts;

DETAILED DESCRIPTION

In the description that follows, it should be understood that a graphical data system (GDS) provides a known format for layout data for pattern generation to control integrated circuit wafer manufacturing. The long dimension of a row of integrated circuit cells is referred to as horizontal and the "width" may be measured in the horizontal direction. The "vertical" direction lies in the plane of the layout and perpendicular to the horizontal direction, and "height" may be measured in the vertical direction. The layout embodiments can be implemented in masks for contact, proximity, or projection photolithography processes. The logic cell structure may include various elements therein and/or layers thereon. These can include metal or other interconnect layers, barrier layers, dielectric layers, device structures, active elements, and passive elements.

It should be noted that even the techniques have been described in respect of a p-type substrate comprising deep n-well structure, the disclosed techniques may similarly be implemented in a n-type substrate comprising deep p-well structure.

It should be noted that the term "terminator" and "terminator cell" has been interchangeably used throughout the specification.

Figure 1:
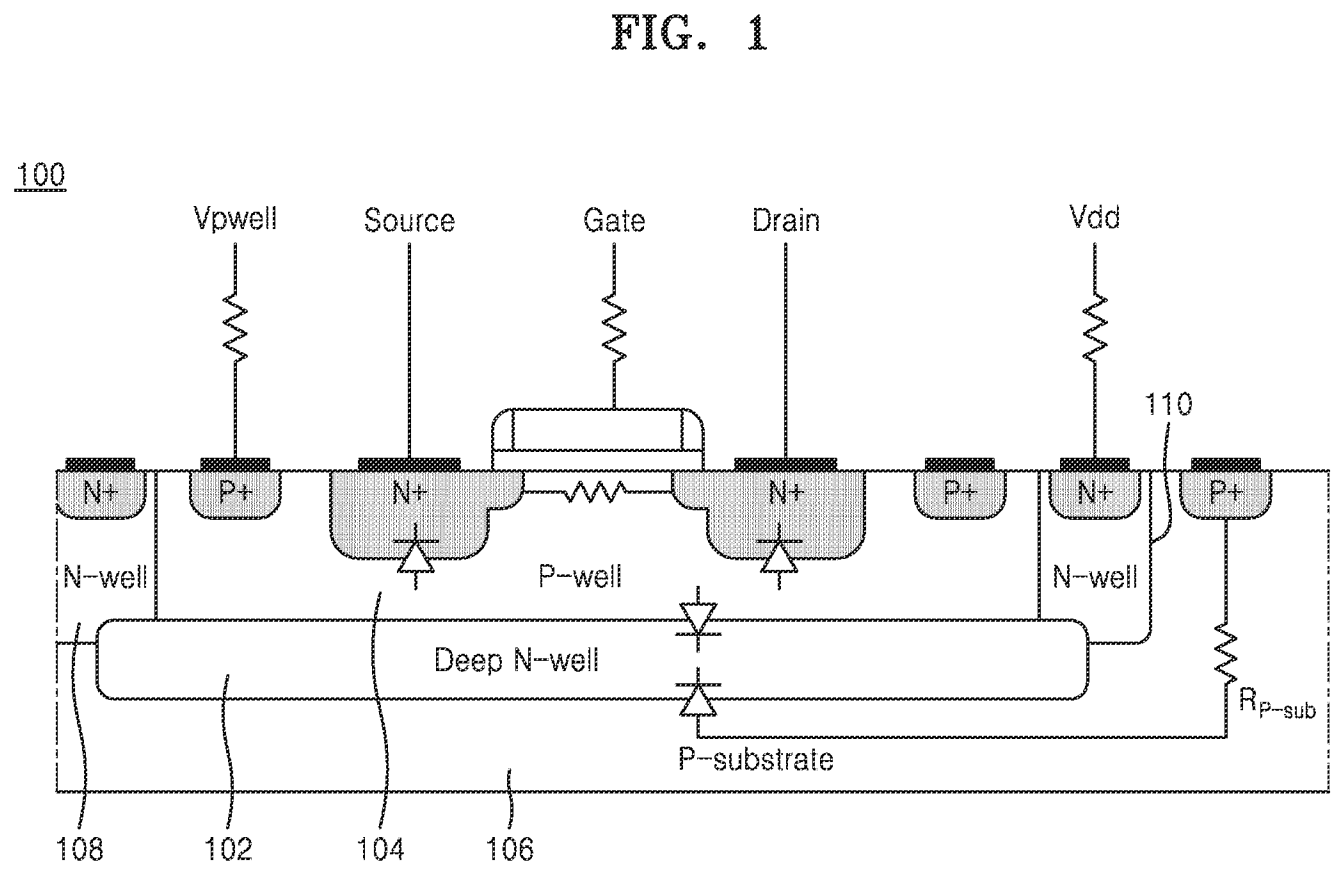

FIG. 1 illustrates a sectional view of a deep n-well structure, according to embodiments of the inventive concepts. As shown in FIG. 1, a p-type substrate 106 comprises a deep N-well structure 102. A plurality of surface N well (108, and 110) are coupled to each side of the deep N-well structure 102. Furthermore, in the deep N-well structure, transistor devices may be placed in the deep N-well 102. The deep well is biased to a certain potential based on the type of the deep well. For example, in an embodiment, the p-type deep well may be biased to positive potential and the N-type deep well may be biased to negative or ground potential.

Figure 2:
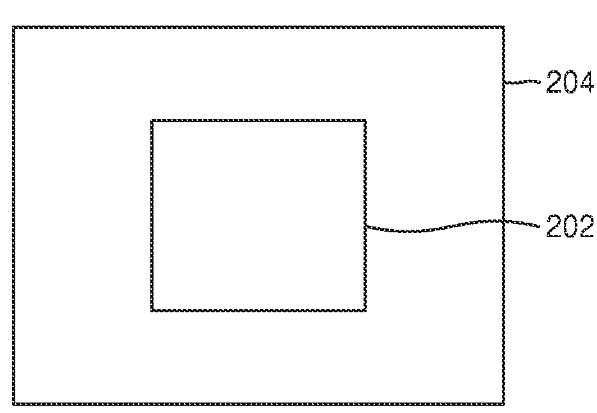
FIG. 2 illustrates a top view of a deep n-well structure, according of the inventive concepts.

FIG. 2 illustrates a top view of a deep n-well structure, according of the inventive concepts. As shown in FIG. 2, An extra layer, i.e., deep N-well 204 may be added to the deep n-well structure 202, while implementing the dual-well structure 202 in a layout or a graphic data stream (GDS). Thus, a triple n-well structure is formed to provide further isolation to transistor devices from noise.

Figure 3:
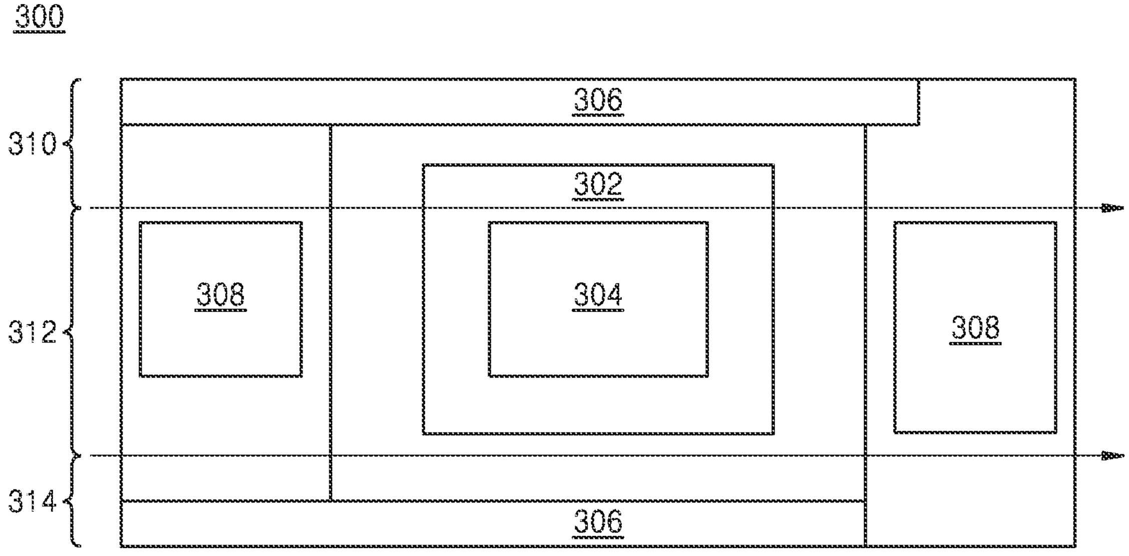
FIG. 3 illustrates a top view of a deep n-well structure with a plurality of voltage devices, according to embodiments of the inventive concepts.

FIG. 3 illustrates a top view of a deep n-well structure with a plurality of devices, according to embodiments of the inventive concepts. In an embodiment, when the plurality of devices are connected in the deep n-well structure, the deep N-well structure provides isolation between the plurality of devices operating at different voltage. Accordingly, as shown in FIG. 3, the structure may include a first deep N-well 302, a second deep N-well 306, a first device 304 and a plurality of second devices 308, wherein the first device 304 and the plurality of second devices 308 operate at different voltages. Accordingly, the first deep N-well 302, a second deep N-well 306 may provide isolation between the first device 304 and the plurality of second devices 308. In an embodiment, the voltage of the first deep N-well 302 and the second deep N-well 306 may be different. As shown in FIG. 3, in an embodiment, the first device 304 is placed in the first deep N-well 302, and the second device 308 is placed in the second deep N-well 306 Further, the deep N-well structure may be divided into a top deep N-well 310, a middle portion 312, and a bottom deep N-Well 314. In an embodiment, the deep N-well structure may be divided based on a pattern of placement of the devices in the deep N-well. For example, if the devices 304, 308 are placed such that they are not placed in top and bottom portion of the deep N-well, then the deep N-well structure may be divided into three portions, i.e., top deep N well 310, a middle portion 312, a bottom deep N-Well 314. Accordingly, the devices 304, 308 may be present in the middle portion 312. In particular, the first device 304 may be placed in middle portion of the first deep N-well 302 and the second device 308 may be placed in middle portion of the second deep N-well 306. The top deep N well structure 310 may be referred as a top terminator. The bottom deep N-well structure 314 may be referred as a bottom terminator. Hence, the voltage devices are isolated in cluster by the top and bottom terminator, thereby eliminating requirement of multiple deep N-well structure for isolation.

Figure 4:
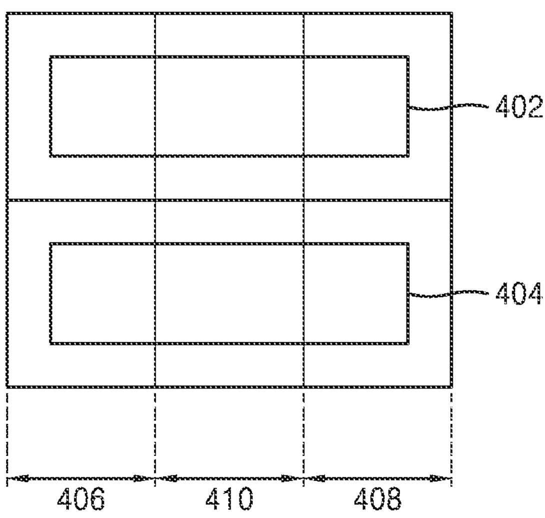
FIG. 4 illustrates a diagram depicting a logic cell according to embodiments of the inventive concepts.

FIG. 4 illustrates a diagram illustrating a top plan view of a logic cell 400, according to embodiments of the inventive concepts. In example embodiments, the logic cell 400 may be a standard cell, a custom cell, macro cells or blocks, or a configurable cell, and in other embodiments may be other types of cells. The logic cell 400 may include a group of transistors and interconnect structures that configure a boolean logic function (e.g., AND, OR, XOR, XNOR, inverters) or a storage function (e.g., a flip-flop or a latch). The logic cell 400 may include at least two active regions separated by at least one isolation region. The logic cell 400 may include a plurality of cells. Referring to FIG. 4, the logic cell 400 may include a plurality of cells/devices 402, 404. In an embodiment, when the plurality of devices are connected in the deep n-well structure, the deep N-well structure provides isolation between the plurality of devices operating at different voltage. Accordingly, as shown in FIG. 4, the structure may include a first guard ring 406, a second guard ring 408, a first device 402 and a plurality of second devices 404, wherein the first device 402 and the plurality of second devices 404 operate at different voltages. Accordingly, the first guard ring 406, a second guard ring 408 may provide isolation between the first device 402 and the plurality of second devices 404. In an embodiment, the voltage of the first guard ring 406 and the second guard ring 408 may be different. As shown in FIG. 4, the logic cell structure may be divided into a left guard ring structure 406, a right guard ring structure 408, and a middle portion 410. In an embodiment, the logic cell structure of FIG. 4 may be divided based on a pattern of placement of the devices in the logic cell. For example, if the devices 402, 404 are placed such that they are not placed in left and right portion of the guard ring structure, then the deep N-well structure may be divided into three portions, i.e., left guard ring structure 406, a right guard ring structure 408, and a middle portion 410. Accordingly, the devices 402, 404 may be present in the middle portion 410. The left guard ring structure 406 may be referred as a left terminator. The right guard ring structure 408 may be referred as a right terminator. Hence, the voltage devices are isolated in cluster by the left and right terminator, thereby eliminating requirement of multiple guard ring structure for isolation. Further, it shall be noted that the logic cell structure of FIG. 4 may be divided in a way such that first guard ring 406 and the second guard ring 408 form a top terminator and a bottom terminator and the first and second devices are placed in a middle portion.

Hence, in an embodiment, a terminator cell is a combination of layers placed in a specific manner, wherein the layers of the terminator are of the same material as that of the deep well structure.

Thus, according to example embodiments, if the cells of the plurality of cells of a logic cell are placed side by side in a single row, the logic cell may include at least one terminator cell placed at the left side of the single row and at least one terminator cell at right side of the single row.

Figure 5:
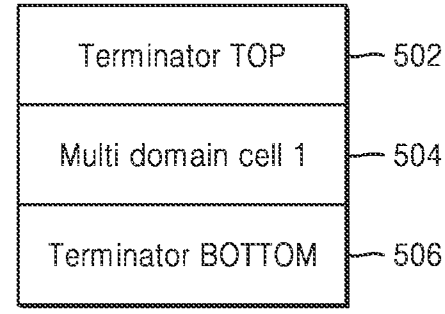
FIG. 5 illustrates a diagram of a single multi-domain cell according to embodiments of the inventive concepts.

FIG. 5 illustrates a diagram of a logic cell 500 including a single multi-domain cell, according to embodiments of the inventive concepts. As shown in the side view of FIG. 5, the single multi-domain cell 504 may be isolated by a top terminator cell 502 and bottom terminator cell 506. In an embodiment, FIG. 5 represents another embodiment of FIG. 3.

Figure 6:
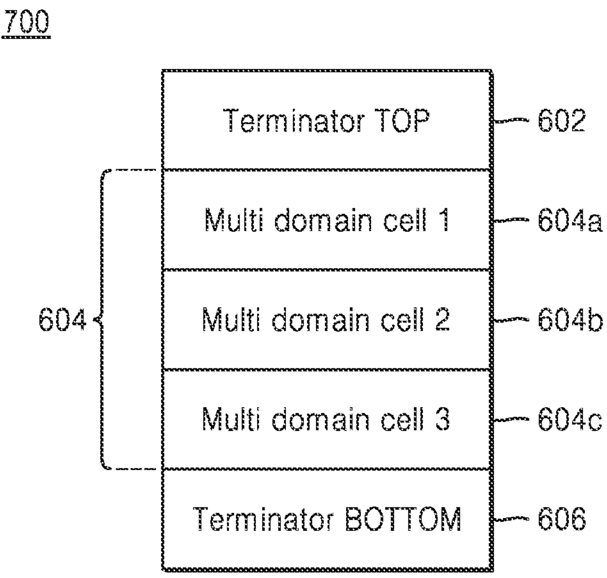
FIG. 6 illustrates a diagram of a logic cell including a cluster of multi-domain cell, in accordance with an embodiment of the present disclosure.

FIG. 6 illustrates a diagram of a logic cell 600 including a cluster of multi-domain cells, according to embodiments of the inventive concepts. As shown in the side view of FIG. 6, the logic cell 600 has a cluster of cells 604 including a multi-domain cell 1 604*a*, a multi-domain cell 2 604*b* and a multi-domain cell 3 604*c*. The cluster of cells 604 may be isolated by a top terminator cell 602 and a bottom terminator cell 606. In other example embodiments, the logic cell 600 may include any number of multi-domain cells other than the three shown in FIG. 6. This embodiment is further explained in reference to FIG. 10.

Thus, according to example embodiments, if the plurality of cells is placed above one another in a single column cell, the logic cell may include at least one terminator cell placed at top and at least one terminator cell at bottom of the column.

Figure 7:
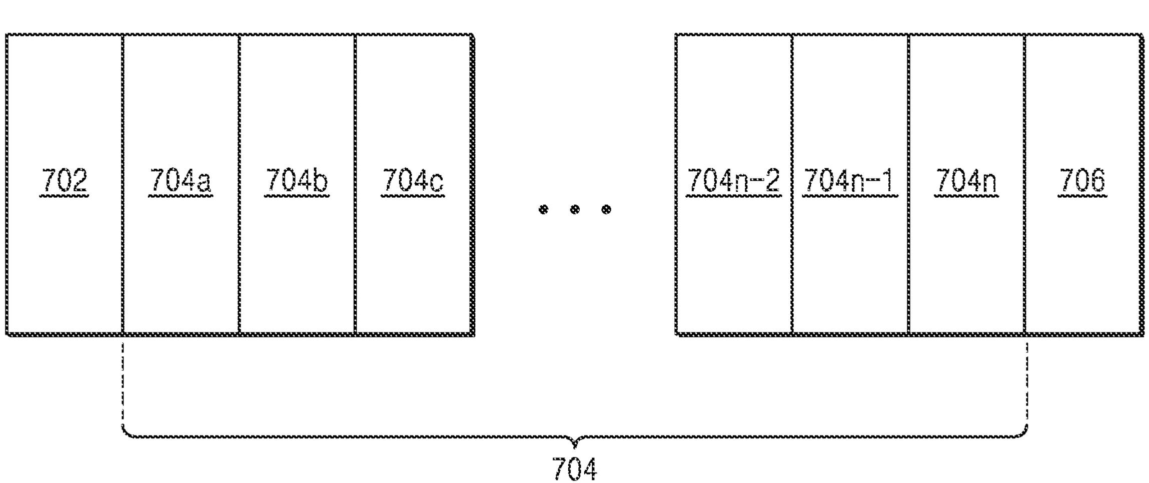
FIG. 7 illustrates a diagram of a logic cell configured as a 2D array, according to embodiments of the inventive concepts.

FIG. 7 illustrates a diagram showing top plan view of a logic cell 700 configured as a one-dimensional (1D) array according to embodiments of the inventive concepts. In an embodiment, FIG. 7 further explains embodiment of FIG. 5. The 1D array consists of plurality of columns of cells. As shown in the top plan view of FIG. 7, the 1D array may include a cluster of multi-domain cells 704. The top row of the multi-domain cells 704 may include multi-domain cell 1 (704*a*), multi-domain cell (704*b*), . . . , and multi domain cell N (704*n*). The terminator cells placed at the left and right sides of the array. i.e., terminator 702, 706, provide isolation between the multi-domains (704*a* . . . 704*n*). In particular, left terminator cell 702 is placed at left side of the array and right terminator cell 706 is placed at right side of the array. Each column under the top row may include a similar configuration of a left terminator cell 702, multi-domain cells 704*a* to 704*n*, and a right terminator cell 706. In an embodiment, the plurality of terminator cell may include one or more first terminator cells, one or more second terminator cell, one or more third terminator cell, and one or more fourth terminator cells. For example, one or more first terminator cell may be left terminator cell 702, one or more second terminator cell may be the right terminator cell 706, one or more third terminator cell may be the top terminator cell and one or more fourth terminator cells may be the bottom terminator cell. Further, as shown in FIG. 7, if the plurality of cells is placed in a 1D array including a plurality of columns, the logic cell may include one or more first terminator cells may be placed at a left side of the two-dimensional array, and one or more second terminator cells may be placed at a right side of the two-dimensional array. Further, the logic cell may include one or more third terminator cells may be placed at a top of the two-dimensional array and one or more fourth terminator cells may be placed at a bottom of the two-dimensional array.

Thus, according to example embodiments, if the plurality of cells is placed in a 1D array including a plurality of columns, the logic cell may include at least one terminator cell placed at the left side of the array and at least one terminator cell placed at the right side of the 1D array, or at least one terminator cell placed at the top of the array and at least one terminator cell placed bottom of the array. Even though FIG. 7 has been explained for a 1D array including plurality of columns, same techniques may be applied for a 1D array including a plurality of rows.

Figure 8:
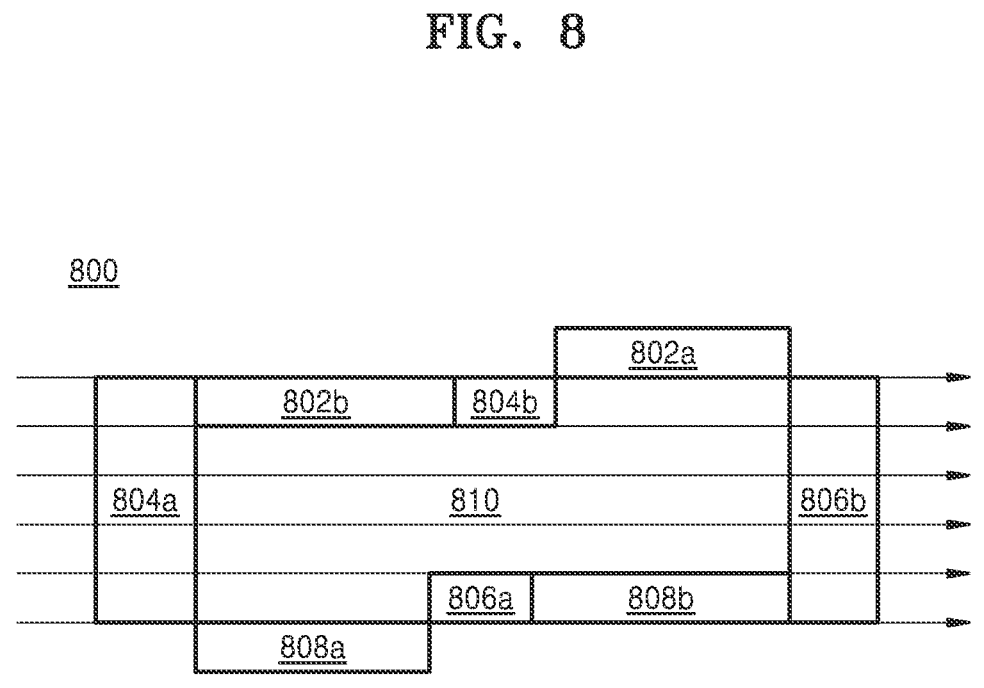

FIG. 8 illustrates a diagram of a logic cell 800 having a non-rectangular structure, according to embodiments of the inventive concepts. The non-rectangular structure consists of a plurality of rows and a plurality of columns of multi-domain cells 810 as shown in FIG. 8. In example embodiments, the terminator cells may be either placed at the left side of the logic cell 800, i.e., left terminator 804*a-b* or the right-side of the logic cell 800, i.e., terminator 806*a-b*. In other example embodiments, the terminator cells may be placed at the top side of the logic cell 800, i.e., top terminator 802*a-b* and at the bottom side of the logic cell 800, i.e., the bottom terminator 808*a-b*. In still further example embodiments, the terminator cells may be placed at all edges of the logic cell 800, for example at left side terminator 804*a-b*, the right side terminator 806*a-b*, the top terminator 802*a-b* and the bottom terminator 808*a-b* of the logic cell 800.

In an embodiment, the plurality of terminator cells may include one or more first terminator cells, one or more second terminator cell, one or more third terminator cell, one or more fourth terminator cells, one or more fifth terminator cells, one or more sixth terminator cells, one or more seventh terminator cells, and one or more eight terminator cells. With reference to FIG. 8, one or more first terminator cells may be the left terminator cells 804*a*, one or more second terminator cell may be the right terminator cell 808*a*, one or more third terminator cell may be the top terminator cell 802*a*, one or more fourth terminator cells may be the bottom terminator cells 806*a*, one or more fifth terminator cells may be the left terminator cells 804*b*, one or more sixth terminator cells may be the right terminator cell 808*b*, one or more seventh terminator cells may be the top terminator cells 802*b*, and one or more eight terminator cells may be the bottom terminator cell 806*b*. Further, if the plurality of cells is placed such that they form a non-rectangular structure, the logic cell may include one or more first terminator cells may be placed at a left side of the non-rectangular structure and one or more second terminator cells may be at a right side of the non-rectangular structure. The logic cell may include one or more third terminator cells may be placed at a top of the non-rectangular structure. Further, the logic cell may include one or more fourth terminator cells may be placed at a bottom of the of the non-rectangular structure. Furthermore, the logic cell may include one or more fifth terminator cells may be placed at the left side of the non-rectangular structure. The logic cell may include one or more sixth terminator cells may be placed at the right side of the non-rectangular structure. The logic cell may include one or more seventh terminator cells may be placed at the top of the non-rectangular structure and one or more eight terminator cells may be placed at the bottom of the logic cell.

Thus, according to example embodiments, if the plurality of cells are placed such that they form a non-rectangular structure, the logic cell may include at least one of at least one terminator cell placed at the left side of the logic cell and at least one terminator cell placed at right side of the logic cell, or at least one terminator cell placed at the top of the logic cell and at least one terminator cell placed at the bottom of the logic cell, or at least one terminator cell placed at the left side of the logic cell, at least one terminator cell placed at the right side of the logic cell, at least one terminator cell placed at the top of the logic cell and at least one terminator cell placed at the bottom of the logic cell.

FIGS. 9-12 illustrate logic cell implementations in accordance with example embodiments of the inventive concepts.

Figure 9:
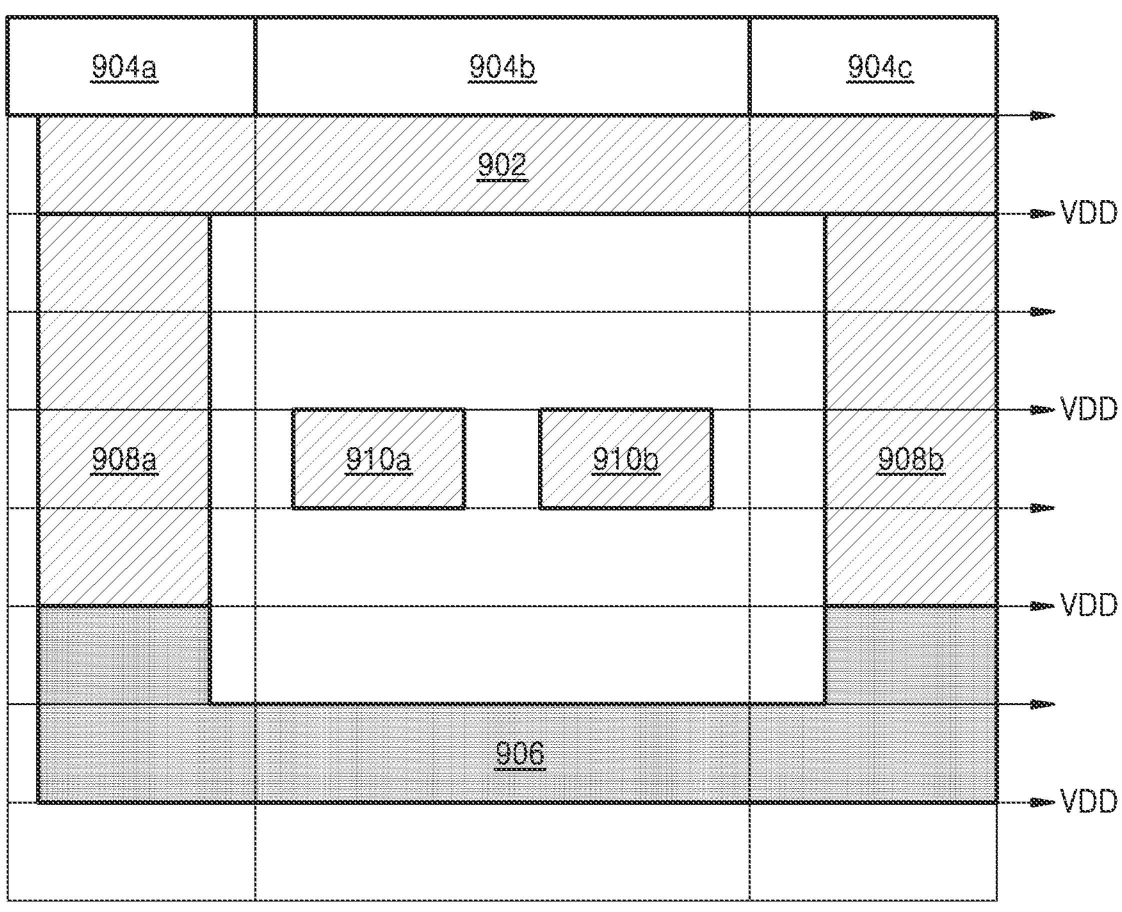
FIG. 9 illustrates a diagram of a cell of the logic cell according to embodiments of the inventive concepts.

FIG. 9 illustrates a diagram of a logic cell 900 in accordance with embodiments of the inventive concepts. FIG. 9 depicts logic cell 900 having a multi-domain cell 904 including domain 1, cell 1 908*a*; domain 2, cell 1 910*a*; domain 2, cell 2 910*b*; and domain 1, cell 2 908*b*, where the cells may be placed side by side in the multi-domain 904*a-c*. The multi-domain cell 904 may be isolated by a top terminator 902 and a bottom terminator 906. Hence, the multi-domain cells may be isolated by only a top terminator 902 and the bottom terminator 906. Therefore, an isolation mechanism, such as deep well, is not required for each domain cell.

Figure 10:
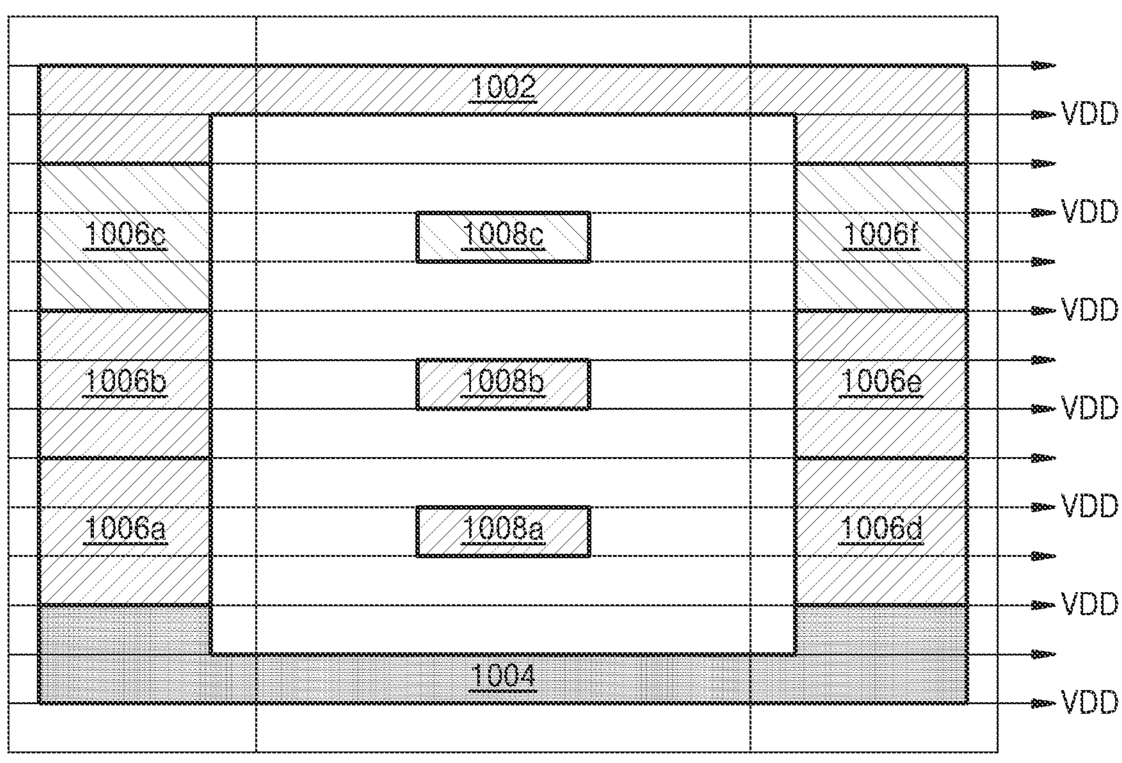
FIG. 10 illustrates a diagram of a single column cell of the logic cell according to embodiments of the inventive concepts.

FIG. 10 illustrates a diagram of a logic cell 1000 of a single column cell of a logic cell in accordance with embodiments of the inventive concepts. FIG. 10 depicts a multi-domain cell having a single column cell in a deep well, and that may be isolated by a top terminator 1002 and a bottom terminator 1004. The multi-domain cells 1000 include 3 cells, i.e., first cell includes domain 1 1006*a*, domain 2 1008*a* and domain 1 1006*d*, second cell includes domain 1 1006*b*, domain 2 1008*b* and domain 1 1006*e* and third cell includes domain 1 1006*c*, domain 2 1008*c* and domain 1 1006*f*. Each cell of the cluster of multi-domain cells 1006*a-f* and 1008*a-c* may be updated to remove its corresponding guard ring structure/deep well structure so that the area at each cell level is reduced, and then the terminator cells are placed as the top terminator 1002 and the bottom terminator 1004 on the edges of the cluster of multi-domain cells 1006*a-f* and 1008*a-c*. As disposed at the edges of the logic cell 1000, the terminator cells provide the required guard ring structure by completing the ring structure at the edges of the logic cell 400, thus removing the redundancy of a well ring/guard ring structure in the individual cells of the cluster of multi-domain cells 1006*a-f* and 1008*a-c*.

Figure 11:
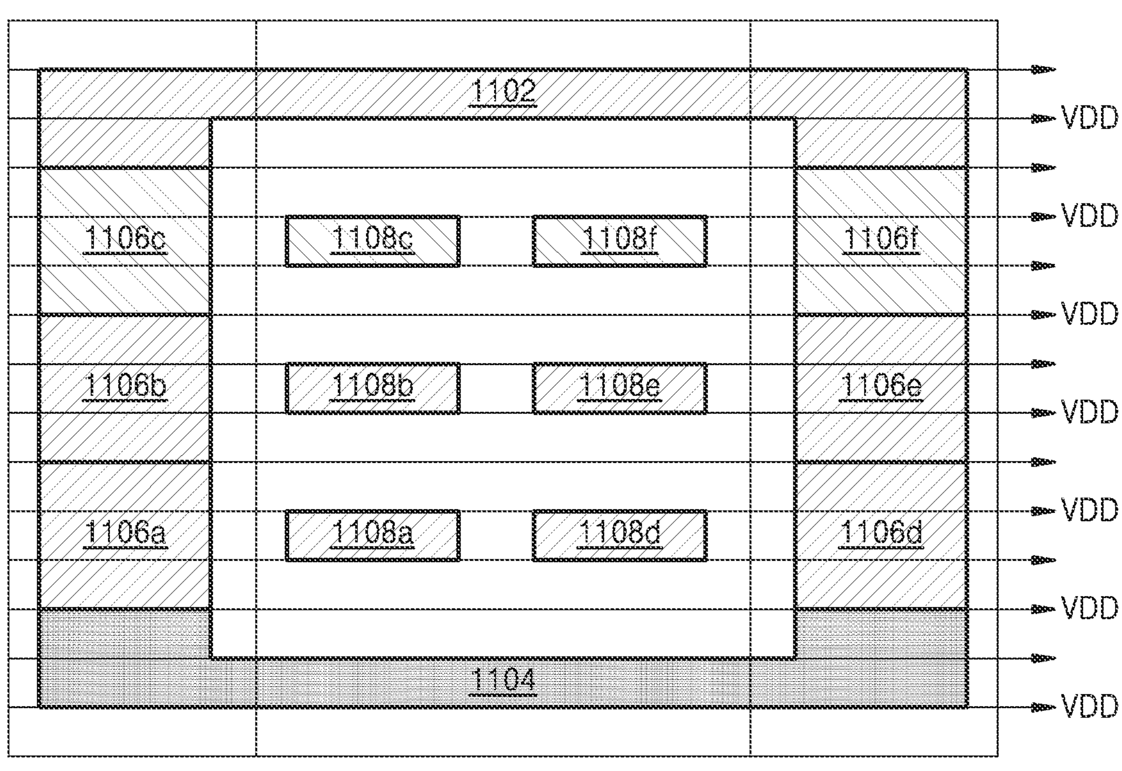
FIG. 11 illustrates a diagram of a multi-cell according to embodiments of the inventive concepts.

FIG. 11 illustrates a diagram of a multi-domain cell 1100 in accordance with embodiments of the inventive concepts. FIG. 11 explains another embodiment of FIG. 10. As shown in FIG. 11, domain In this example embodiment, 6 cells are implemented side-by-side shown as shown in FIG. 11. The multi-domain cells 1100 include domain 1 includes 6 cells 1106*a-f*, and domain 2 includes 6 cells 1108*a-f*. Each cell of the cluster of multi-domain cells 1106*a-f* and 1108*a-f* may be updated to remove its corresponding guard ring structure so that the area at each cell level is reduced, and then the terminator cells are placed as a top terminator 1102 and a bottom terminator 1104 on the edges of the cluster of multi-domain cells 1106*a-f* and 1108*a-f*. As disposed at the edges of the logic cell 1100, the terminator cells provide the required guard ring structure by completing the ring structure at the edges of the logic cell 400, thus removing the redundancy of a well ring/guard ring structure in the individual cells of the cluster of multi-domain cells 1106*a-f* and 1108*a-f*.

Figure 12:
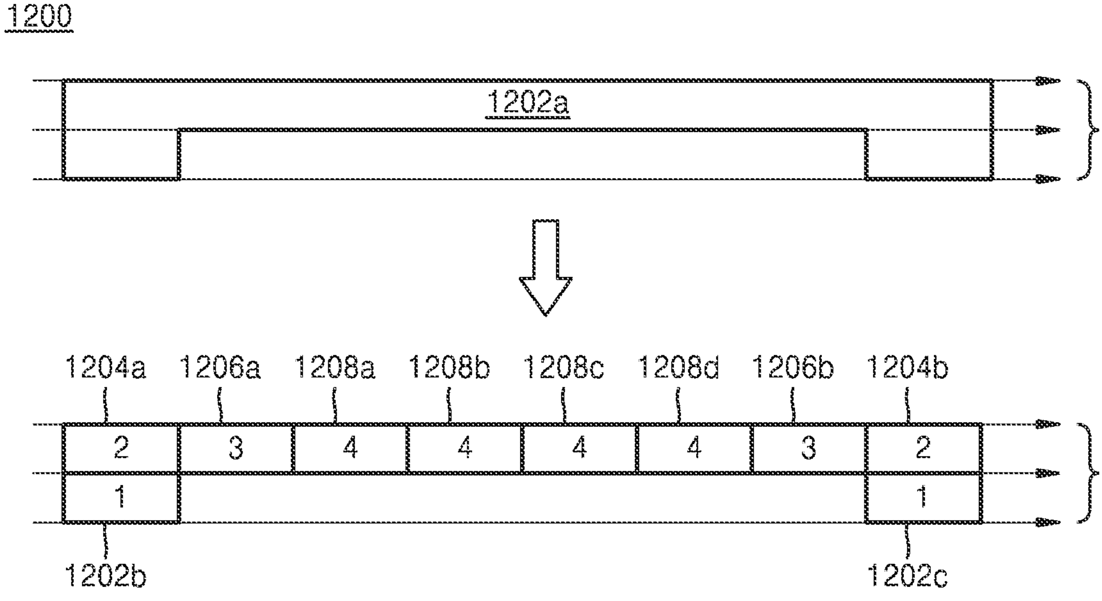
FIG. 12 illustrates a diagram depicting splitting of a terminator top/bottom cell a cluster of multiple cells, in accordance with embodiments of the inventive concepts.

In an embodiment, at least one terminator cell from among the plurality of the terminator cells is divided into multiple cells including corner terminator cells. FIG. 12 illustrates a diagram depicting splitting of a terminator top/bottom cell a cluster of multiple cells, in accordance with embodiments of the inventive concepts. The terminator top and bottom can be a single cell or a cluster of many cells. According to exemplary embodiments, a terminator cell may be modified by dividing the terminator cells into multiple cells, wherein the multiple cells include a corner terminator cell. The terminator top/bottom cell may be split into a cluster of multiple cells to achieve the structure of a terminator cell and provide the isolation functionality. The terminator cell 1202 may be of different types such as bottom corner cells 1202*b-c*, top corner cells 1204*a-b*, middle corner cells 1206*a-b* and middle cells 1208*a-d*. The cells 1202*a-c* may be placed at the boundary of structure. The cells 1204*a-b* may be placed at the edges of structure. The type 3 cell 1206*a-b* may be placed between the edges.

Figure 13:
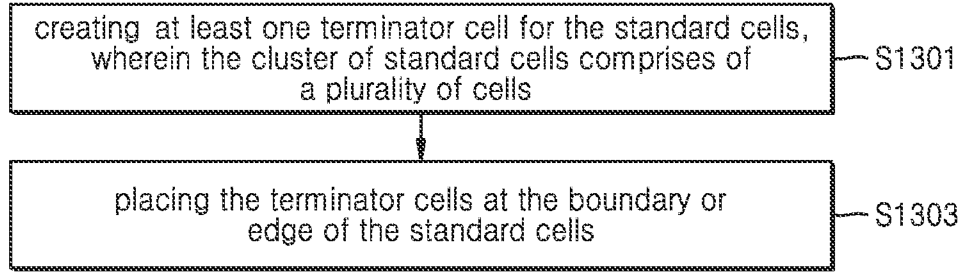
FIG. 13 illustrates a flow diagram depicting a method of optimizing area of logic cell according to embodiments of the inventive concepts.

FIG. 13 illustrates a flow diagram 1300 explanatory of a method of optimizing area in a logic cell according to embodiments of the inventive concepts. In example embodiments, the method of optimizing area may be implemented automatically by any known device/apparatus such as a functional electronic circuit, also known as a tool or place-and-route (P & R) tool. In other example embodiments, the method of optimizing area may be implemented manually.

At step S1301, the method 1300 includes creating a plurality of terminator cells for the logic cell. In example embodiments, the logic cell may include a plurality of cells.

At step S1303, the method 1300 includes placing the plurality of terminator cells at the boundary or edge of the logic cell. In example embodiments, a cluster of the multi-cells may be placed together and at the edges of the logic cell. Further, each multi-domain cell may be updated to remove its corresponding ring structure, then the left and right terminator cells may be placed on the edges of the logic cell. As a result, the area at each cell level of the logic cell is reduced. In example embodiments, the terminator cells may be specific to an architecture/technology. The terminator cells may be designed to provide a clean abutment with any area compact multi-domain cell. For cases in which the cluster of cells is placed with other logic cells, the other edge of terminator cells may be designed for clean abutment with any such logic cell.

According to example embodiments, step S1303 may include determining if the cells of the plurality of cells are placed side by side in a single row. Upon determining that cells of the plurality of cells are placed side by side in a single row, S1303 may include placing at least one terminator cell at the left side of the single row and at least one terminator cell at the right side of the single row.

According to example embodiments, step S1303 may include determining if the cells of the plurality of cells are placed above one another in the single column cell. Upon determining that cells of the plurality of cells are placed above one another in a single column, step S1303 may include placing at least one terminator cell at the top of the column and at least one terminator cell at the bottom of the column.

According to example embodiments, step 1303 may include modifying the terminator cells placed at the top and the bottom of the single column by dividing the terminator cells into multiple cells. The multiple cells may include corner terminator cells and a filler between the corner terminator cells.

According to example embodiments, step S1303 may include determining if the cells of the plurality of cells are placed in a 2D array comprising of a plurality of rows and a plurality of columns. Upon determining that cells of the plurality of cells are placed in a 2D array comprising of a plurality of rows and a plurality of columns, step S1303 may include placing at least one terminator cell either at the left side of the 2D array and the right side of the 2D array, or at the top of the 2D array and the bottom of the 2D array. In particular, the plurality of terminator cell may include one or more first terminator cells, one or more second terminator cells, one or more third terminator cells, and one or more fourth terminator cells. For example, one or more terminator cell may be left terminator cell, one or more second terminator cell may be the right terminator cells, one or more third terminator cells may be the top terminator cells and one or more fourth terminator cells may be the bottom terminator cells, as shown in FIG. 7. Further, one or more first terminator cells may be placed at a left side of the two-dimensional array and one or more second terminator cells at a right side of the two-dimensional array. Further, one or more third terminator cells may be placed at a top of the two-dimensional array and one or more fourth terminator cells at a bottom of the two-dimensional array.

According to example embodiments, step S1303 may include determining if the cells of the plurality of cells are placed such that they form a non-rectangular structure. The non-rectangular structure may consist of a plurality of rows and a plurality of columns. Upon determining that cells of the plurality of cells are placed in the form of a non-rectangular structure, step S1303 may include placing the terminator cell either at the left side and the right side of the structure, or at the top and the bottom of the structure, or at the left side, the right side, the top and the bottom of the structure. In particular, the plurality of terminator cells may include one or more first terminator cells, one or more second terminator cell, one or more third terminator cell, one or more fourth terminator cells, one or more fifth terminator cells, one or more sixth terminator cells, one or more seventh terminator cells, and one or more eight terminator cells. For example, one or more first terminator cells may be the left terminator cells, one or more second terminator cell may be the right terminator cell, one or more third terminator cell may be the top terminator cell, one or more fourth terminator cells may be the bottom terminator cells, one or more fifth terminator cells may be the left terminator cell, one or more sixth terminator cells may be the right terminator cell, one or more seventh terminator cells may be the top terminator cells, and one or more eight terminator cells may be the bottom terminator cell as shown in FIG. 8.

In an embodiment, one or more first terminator cells from among the plurality of terminator cells may be placed at a left side of the non-rectangular structure. One or more second terminator cells from among the plurality of terminator cells may be placed at a right side of the non-rectangular structure. Further one or more third terminator cells may be placed at a top of the non-rectangular structure and one or more fourth terminator cells at a bottom of the non-rectangular structure, one or more fifth terminator cells may be placed at the left side of the non-rectangular structure, one or more sixth terminator cells may be placed at the right side of the non-rectangular structure, one or more seventh terminator cells may be placed at the top of the non-rectangular structure, and one or more eighth terminator cells may be placed at the bottom of the non-rectangular structure as shown in FIG. 8.

Figure 14:
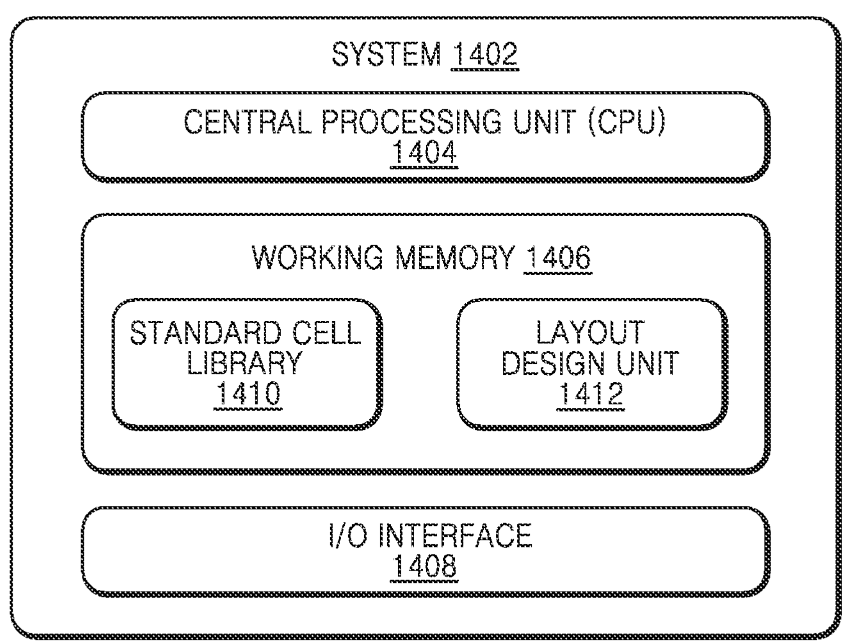
FIG. 14 illustrates a block diagram of a system for optimizing area of logic cell according to embodiments of the inventive concepts.

FIG. 14 illustrates a block diagram of a system 1402 for optimizing area of a logic cell according to embodiments of the inventive concepts. System 1402 may be provided as a functional electronic circuit known as a design tool or layout tool or place-and-route (P&R) tool. Referring to FIG. 10, the design tool 1402 may include a central processing unit (CPU) 1404, a working memory 1406, and an input/output (I/O) interface 1408. The I/O interface 1408 may control user input and output operations of user interfaces. The logic cell may be stored in a logic cell library 1410 within the working memory 1406. Specifically, the logic cell library 1510 may include information about a plurality of logic cells.

According to example embodiments, a layout design 1412 may be loaded in the working memory 1406. The working memory 1406 may include at least one from among volatile memory (e.g., static random-access memory (SRAM) or dynamic random-access memory (DRAM)) or non-volatile memory (e.g., phase-change RAM (PRAM), magneto resistive RAM (MRAM), resistive RAM (ReRAM), ferroelectric RAM (FRAM), or NOR FLASH memory). In a further embodiment, the layout design 1412 may be part any digital design block.

The design tool 1402 may be configured to optimize area of a logic cell. The design tool 1402 may be configured to use ICC/ICC2/Innovus™ methodology. The design tool 1402 may be configured to create at least one terminator cell for the logic cell. The design tool 1402 may be configured to place the terminator cells at the boundary or edge of the logic cell. The logic cell may comprise of a plurality of cells. Further, the logic cell may include a multi-domain cells and multi-well cells. Further, the design tool 1402 may be configured to place the terminators cell at the top and the bottom of the logic cell. The design tool 1402 may be configured to place the terminators cell at the left side and the right side of the logic cell.

According to example embodiments, the design tool 1402 may be configured to determine if the cells of the plurality of cells are placed side by side in a single row. Upon determining that the cells of the plurality of cells are placed side by side in a single row, the P&R tool 1402 may be configured to thereafter place at least one terminator cell at the left side of the single row and at least one terminator cell at right side of the single row.

According to example embodiments, the design tool 1402 may be configured to determine if the cells of the plurality of cells are placed above one another in a single column. Upon determining that the cells of the plurality of cells are placed above one another in a single column, the design tool 1402 may be configured to thereafter place at least one terminator cell at the top of the column and at least one terminator cell at the bottom of the column.

According to example embodiments, the design tool may be configured to modify the terminator cells placed at the top and the bottom of the single column by dividing the terminator cells into multiple cells. The multiple cells may include corner terminator cells and a filler between the corner terminator cells.

According to example embodiments, the design tool 1402 may be configured to determine if the cells of the plurality of cells are placed in a 2D array comprising of a plurality of rows and a plurality of columns. Upon determining that the cells of the plurality of cells are placed in a 2D array, the design tool may be configured to place at least one terminator cell either at the left side and the right side of the 2D array, or at the top and the bottom of the 2D array. In particular, the plurality of terminator cell may include one or more first terminator cells, one or more second terminator cells, one or more third terminator cells, and one or more fourth terminator cells. Further, the design tool 1402 may be configured to place one or more first terminator cells at a left side of the two-dimensional array and one or more second terminator cells at a right side of the two-dimensional array. Further, the design tool 1402 may be configured to place one or more third terminator cells at a top of the two-dimensional array and one or more fourth terminator cells at a bottom of the two-dimensional array.

According to example embodiments, the design tool 1402 may be configured to determine if the cells of the plurality of cells are placed such that they form a non-rectangular structure. The non-rectangular structure may consist of a plurality of rows and a plurality of columns. Upon determining that the cells of the plurality of cells are in the form of a non-rectangular structure, the design tool 1402 may be configured to place the terminator cell either at the left side and the right side of the structure, or at the top and the bottom of the structure, or at the left side, the right side, the top and the bottom of the structure. Further, the design tool 1402 may be configured to place one or more first terminator cells at a left side of the non-rectangular structure. The design tool 1402 may be configured to place one or more second terminator cells at a right side of the non-rectangular structure. Further the design tool 1402 may be configured to place one or more third terminator cells at a top of the non-rectangular structure and one or more fourth terminator cells at a bottom of the non-rectangular structure. Furthermore, the design tool 1402 may be configured to place one or more fifth terminator cells at the left side of the non-rectangular structure. Further, the design tool 1402 may be configured to place one or more sixth terminator cells at the right side of the non-rectangular structure. The design tool 1402 may be configured to place one or more seventh terminator cells at the top of the non-rectangular structure. Furthermore, the design tool 1402 may be configured to place one or more eighth terminator cells at the bottom of the non-rectangular structure.

Table 1 as shown hereinafter depicts examples of area gain for respective level shifters including 1 cell, 2 cells, 3 cells, 5 cells and 10 cells in accordance with embodiments of the inventive concepts. For example, by configuring a 14 nm level shifter using terminator cells as described in example embodiments of the inventive concepts, when 10 cells are used in a design an area gain of around 67.24% may be achieved as compared to configuring the 14 nm level shifter with each of the 10 cells including a corresponding well ring/guard ring structure. As may be appreciated in view of Table 1, the area gain achieved may be higher when a greater number of cells are used in a cluster. It may be noted area gain will differ based on the technology and the library architecture.

TABLE 1

| Cell | Area before | Area with present invention | % Gain |
|---|---|---|---|
| 1 * LVL cell | 83.685 | 84.34 | −0.78 |
| 2 * LVL cell | 167.37 | 105.43 | 37.00 |
| 3 * LVL cell | 251.055 | 126.51 | 49.60 |
| 5 * LVL cell | 418.425 | 168.68 | 59.68 |
| 10 * LVL cell | 836.85 | 274.12 | 67.24 |

As should be apparent to one of ordinary skill in the art, various changes in form and detail may be made to the embodiments disclosed herein without departing from the spirit and scope of the following claims. The drawings and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment.

We claim:

1. A logic cell comprising:

a plurality of cells; and a plurality of terminator cells at a boundary or edge of the plurality of cells, wherein at least two terminator cells of the plurality of terminator cells extend across a plurality of voltage domains and form portions of a plurality of guard ring structures corresponding to the plurality of voltage domains, and wherein each guard ring structure of the plurality of guard ring structures forms a ring around cells of the plurality of cells in a respective voltage domain of the plurality of voltage domains.

2. The logic cell of claim 1, wherein cells of the plurality of cells are placed side by side in a single row, and the plurality of terminator cells comprises at least one terminator cell at a left side of the single row and at least another one terminator cell at a right side of the single row.

3. The logic cell of claim 1, wherein cells of the plurality of cells are above one another in a single column, and the plurality of terminator cells comprises one or more first terminator cells at a top of the single column and one or more second terminator cells at a bottom of the single column.

4. The logic cell of claim 1, wherein cells of the plurality of cells are in a two-dimensional array comprising of a plurality of rows and a plurality of columns, and the logic cell comprising at least one of:

one or more first terminator cells from among the plurality of terminator cells at a left side of the two-dimensional array and one or more second terminator cells from among the plurality of terminator cells at a right side of the two-dimensional array, and one or more third terminator cells from among the plurality of terminator cells at a top of the two-dimensional array and one or more fourth terminator cells from among the plurality of terminator cells at a bottom of the two-dimensional array.

5. The logic cell of claim 1, wherein cells of the plurality of cells are configured in a form of a non-rectangular structure, wherein the non-rectangular structure consists of a plurality of rows and a plurality of columns, and the logic cell comprises at least one of:

one or more first terminator cells from among the plurality of terminator cells at a left side of the non-rectangular structure and one or more second terminator cells from among the plurality of terminator cells at a right side of the non-rectangular structure, one or more third terminator cells from among the plurality of terminator cells at a top of the non-rectangular structure and one or more fourth terminator cells from among the plurality of terminator cells at a bottom of the non-rectangular structure, and one or more fifth terminator cells from among the plurality of terminator cells at the left side of the non-rectangular structure, one or more sixth terminator cells from among the plurality of terminator cells at the right side of the non-rectangular structure, one or more seventh terminator cells from among the plurality of terminator cells at the top of the non-rectangular structure and one or more eight terminator cells from among the plurality of terminator cells at the bottom of the non-rectangular structure.

6. The logic cell of claim 1, wherein at least one terminator cell from among the plurality of the terminator cells is divided into multiple cells including corner terminator cells and a filler between the corner terminator cells.

7. A method of optimizing area of a logic cell using a design tool, the method comprising:

creating a plurality of terminator cells for the logic cell using the design tool, wherein the logic cell comprises a plurality of cells; and placing the plurality of terminator cells at a boundary or edge of the logic cell, wherein at least two terminator cells of the plurality of terminator cells extend across a plurality of voltage domains and form portions of a plurality of guard ring structures corresponding to the plurality of voltage domains, and wherein each guard ring structure of the plurality of guard ring structures forms a ring around cells of the plurality of cells in a respective voltage domain of the plurality of voltage domains.

8. The method of claim 7, wherein the placing of the plurality of terminator cells comprises:

determining that the plurality of cells are placed side by side in a single row; and placing at least one terminator cell from among the plurality of terminator cells at a left side of the single row and at least another one terminator cell from among the plurality of terminator cells at a right side of the single row.

9. The method of claim 7, wherein the placing of the plurality of terminator cells comprises:

determining that the plurality of cells are placed above one another in a single column; and placing one or more first terminator cells from among the plurality of terminator cells at a top of the single column and one or more second terminator cells from among the plurality of terminator cells at a bottom of the single column.

10. The method of claim 7, wherein the placing of the plurality of terminator cells comprises:

determining that the plurality of cells are placed in a two-dimensional array comprising a plurality of rows and a plurality of columns; and placing at least one of one or more first terminator cells from among the plurality of terminator cells at a left side of the two-dimensional array and one or more second terminator cells from among the plurality of terminator cells at a right side of the two-dimensional array, and one or more third terminator cells from among the plurality of terminator cells at a top of the two-dimensional array and one or more fourth terminator cells from among the plurality of terminator cells at a bottom of the two-dimensional array.

11. The method of claim 7, wherein the placing of the plurality of terminator cells comprises:

determining that the plurality of cells are placed in a form of a non-rectangular structure, wherein the non-rectangular structure consists of a plurality of rows and a plurality of columns; and placing at least one of one or more first terminator cells from among the plurality of terminator cells at a left side of the non-rectangular structure and one or more second terminator cells from among the plurality of terminator cells at a right side of the non-rectangular structure, one or more third terminator cells from among the plurality of terminator cells at a top of the non-rectangular structure and one or more fourth terminator cells from among the plurality of terminator cells at a bottom of the non-rectangular structure, and one or more fifth terminator cells from among the plurality of terminator cells at the left side of the non-rectangular structure, one or more sixth terminator cells from among the plurality of terminator cells at the right side of the non-rectangular structure, one or more seventh terminator cells from among the plurality of terminator cells at the top of the non-rectangular structure, and one or more eighth terminator cells from among the plurality of terminator cells at the bottom of the non-rectangular structure.

12. The method of claim 7, wherein a terminator cell from among the plurality of terminator cells is divided into multiple cells including corner terminator cells and a filler between the corner terminator cells.

* * * * *